US00RE50265E

(19) United States
(12) Reissued Patent
Park

(10) Patent Number: US RE50,265 E
(45) **Date of Reissued Patent: *Jan. 7, 2025**

(54) ORGANIC LIGHT EMITTING DIODE DISPLAY

(71) Applicant: Samsung Display Co., LTD., Yongin-si (KR)

(72) Inventor: Dong-Seop Park, Cheonan-si (KR)

(73) Assignee: SAMSUNG DISPLAY CO., LTD., Yongin-si (KR)

( * ) Notice: This patent is subject to a terminal disclaimer.

(21) Appl. No.: 17/901,464

(22) Filed: Sep. 1, 2022

Related U.S. Patent Documents

Reissue of:
(64) Patent No.: 9,818,807
Issued: Nov. 14, 2017
Appl. No.: 14/871,867
Filed: Sep. 30, 2015

U.S. Applications:
(63) Continuation of application No. 16/684,177, filed on Nov. 14, 2019, now Pat. No. Re. 49,204, which is an application for the reissue of Pat. No. 9,818,807.

(30) Foreign Application Priority Data

Jan. 14, 2015 (KR) ..... 10-2015-0007024

(51) Int. Cl.
*H01L 27/32* (2006.01)
*H01L 51/52* (2006.01)
*H10K 50/844* (2023.01)
*H10K 59/12* (2023.01)
*H10K 59/122* (2023.01)
*H10K 59/124* (2023.01)
*H10K 59/88* (2023.01)

(52) U.S. Cl.
CPC ..... *H10K 59/122* (2023.02); *H10K 50/844* (2023.02); *H10K 59/12* (2023.02); *H10K 59/124* (2023.02); *H10K 59/88* (2023.02)

(58) Field of Classification Search
CPC ..... H01L 27/3246; H01L 27/3223; H01L 27/3244; H01L 27/3258; H01L 51/5253
See application file for complete search history.

(56) References Cited

U.S. PATENT DOCUMENTS 7,186,581 B2 * 3/2007 Seki ..... H01L 27/3223 257/E21.114
8,552,641 B2 * 10/2013 Nakamura ..... G02F 1/1345 313/504
2014/0106111 A1 4/2014 Nam et al.
(Continued)

FOREIGN PATENT DOCUMENTS

KR 2010-0106796 10/2010
KR 10-1084264 11/2011
(Continued)

*Primary Examiner* — Ling X Xu
(74) *Attorney, Agent, or Firm* — KILE PARK REED & HOUTTEMAN PLLC

(57) ABSTRACT

There is provided an organic light emitting diode display including: a substrate having a pixel area and a surrounding area enclosing the pixel area; an OLED formed in the pixel area; an anti-overflowing groove formed in the surrounding area of the substrate; and a dam positioned between the anti-overflowing groove and an end of the substrate.

27 Claims, 5 Drawing Sheets

(56) References Cited

U.S. PATENT DOCUMENTS

| | | | | |
|---|---|---|---|---|
| 2014/0131683 | A1* | 5/2014 | Kim | H01L 51/5253 257/40 |
| 2015/0171367 | A1* | 6/2015 | Moon | H01L 51/5253 257/40 |
| 2016/0013253 | A1* | 1/2016 | Lee | C23C 16/50 257/40 |

FOREIGN PATENT DOCUMENTS

| | | |
|---|---|---|
| KR | 2012-0042068 | 5/2012 |
| KR | 2014-0060601 | 5/2014 |

* cited by examiner

ORGANIC LIGHT EMITTING DIODE DISPLAY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

[Any and all applications for which a foreign or domestic priority claim is identified in the Application Data Sheet as filed with the present application are hereby incorporated by reference under 37 CFR 1.57. This application claims priority to and the benefit of Korean Patent Application No. 10-2015-0007024 filed in the Korean Intellectual Property Office on Jan. 14, 2015, the entire contents of which are incorporated herein by reference.] *This is a continuation reissue application of U.S. patent application Ser. No. 16/684,177 filed Nov. 14, 2019 (now U.S. Pat. No. RE 49,204). U.S. patent application Ser. No. 16/684,177 is a reissue application of U.S. Pat. No. 9,818,807 issued Nov. 14, 2017, which issued from U.S. patent application Ser. No. 14/871,867 filed Sep. 30, 2015. U.S. Pat. No. 9,818,807 claims priority benefit of Korean Patent Application No. 10-2015-0007024, filed on Jan. 14, 2015, in the Korean Intellectual Property Office, the disclosure of which is incorporated herein by reference for all purposes.*

BACKGROUND

Field

The present disclosure relates to a display device, and more particularly, to an organic light emitting diode display.

Description of the Related Technology

An organic light emitting diode (OLED) display includes a matrix of OLEDs each configured to include a hole injection electrode, an organic emission layer, and an electron injection electrode. Each OLED emits light by energy generated when excitons generated by a combination of electrons and holes in the organic emission layer drop from an excited state to a ground state. OLED technology displays a predetermined image by careful control of the emitted light.

The organic light emitting diode display has self-luminance characteristics and unlike a liquid crystal display, does not need a separate light source and therefore may have a reduced thickness and weight. Further, the OLED is a display which represents high quality characteristics, such as low power consumption, high luminance, and a high response rate and therefore has drawn much attention as a next-generation display device.

OLED display needs a process to protect the pixel by encapsulating the pixel using a glass substrate. However, due to the thickness and weight of the glass substrate, thin film encapsulation (TPE) technology which alternately stacks an inorganic layer and an organic layer in at least one layer and encapsulates the laminate has been developed.

The organic layer is applied by a solution process and applied to the display area, and is fluid in nature until is hardened and when it is over-applied, the organic layer overflows out of the display area.

SUMMARY

The present disclosure has been made in an effort to provide an OLED display having the advantage of minimized overflow of the organic material out of a substrate even though the organic material is over-applied at the time of applying the organic material.

An exemplary embodiment provides an OLED display including: a substrate having a pixel area and a surrounding area enclosing the pixel area; an organic light emitting diode formed in the pixel area; an anti-overflowing groove formed in the surrounding area of the substrate; and a dam positioned between the anti-overflowing groove and an end of the substrate.

The OLED display may further include: a semiconductor formed in the pixel area; a gate insulating layer formed on the semiconductor and the substrate; a gate electrode formed on the gate insulating layer; a first interlayer insulating layer formed on the gate electrode and the gate insulating layer; and a source electrode and a drain electrode formed on the first interlayer insulating layer, wherein the anti-overflowing groove is formed through the first interlayer insulating layer and exposes the gate insulating layer.

The OLED display may further include: a buffer layer formed on the substrate, wherein the anti-overflowing groove is formed through the first interlayer insulating layer and the gate insulating layer and exposes the buffer layer.

The OLED display may further include: a second interlayer insulating layer formed on the source electrode and a drain electrode, wherein the OLED includes: a first electrode formed on the second interlayer insulating layer; an organic light emitting layer formed on the first electrode, and a second electrode formed on the organic emission layer.

The OLED display may further include: a pixel defined layer having an opening which is formed on the second interlayer insulating layer and exposes the first electrode, wherein the dam includes a lower layer made of the same material as the second interlayer insulating layer and an upper layer positioned on the lower layer and made of the same material as the pixel defined layer.

The dam may include a first dam and a second dam positioned at both sides, having the anti-overflowing groove disposed there between.

The OLED display may further include: an encapsulation layer positioned on the substrate and covering the pixel area, wherein the encapsulation layer includes at least one inorganic layer and organic layer.

The OLED display may further include: an anti-crack groove positioned between the dam and the end of the substrate.

According to an exemplary embodiment, it is possible to prevent the organic material from leaking out of the substrate by forming the dam and the groove in the surrounding area outside the display area even though the organic material overflows at the time of forming the organic layer.

DETAILED DESCRIPTION

Figure 1:
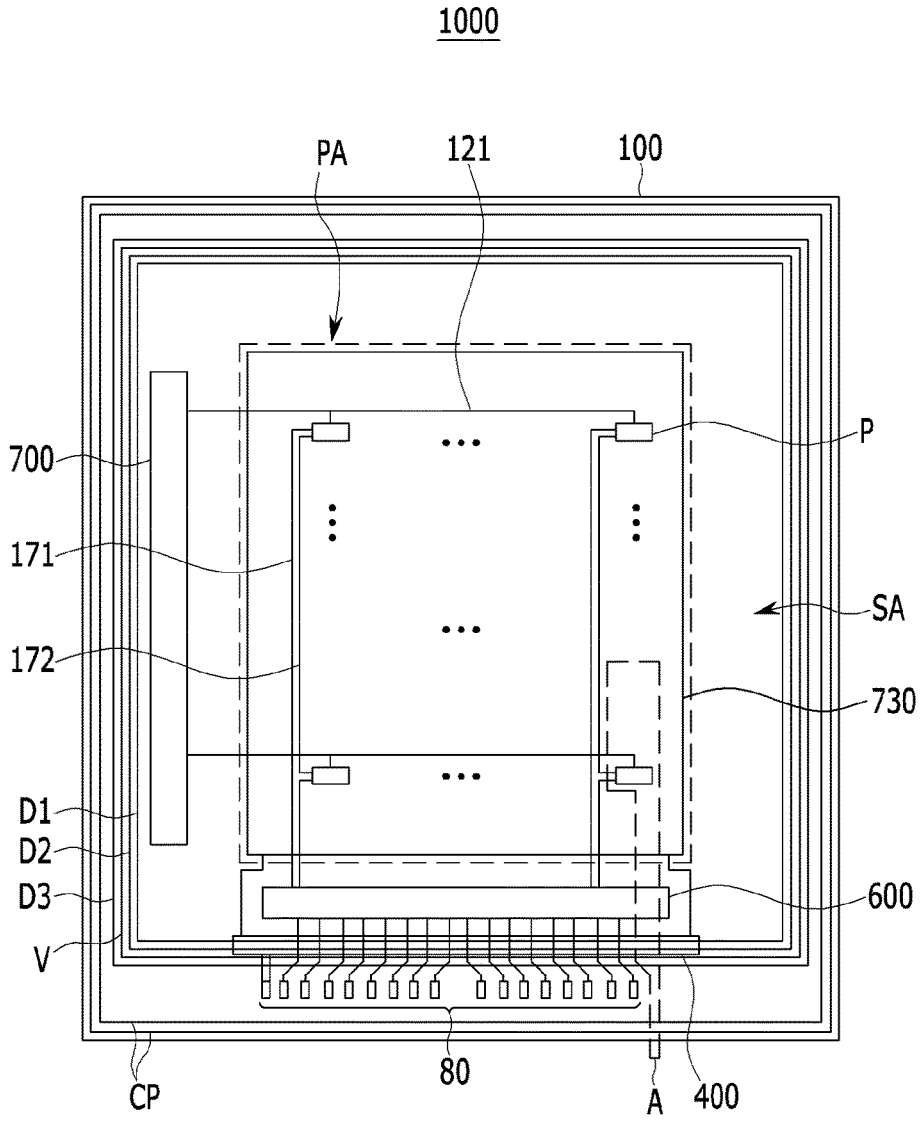
FIG. 1 is a plan view schematically illustrating an OLED display according to an exemplary embodiment.

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. As used herein, the term "and/or" includes any and all combinations of one or more of the associated listed items.

Embodiments of the present disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In the drawings, the thickness of layers, films, panels, regions, etc., are exaggerated for explanation. In other words, since sizes and thicknesses of components in the drawings are arbitrarily illustrated for convenience of explanation, the following embodiments are not limited thereto. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an OLED display according to an exemplary embodiment will be described with reference to the accompanying drawings.

Figure 2:
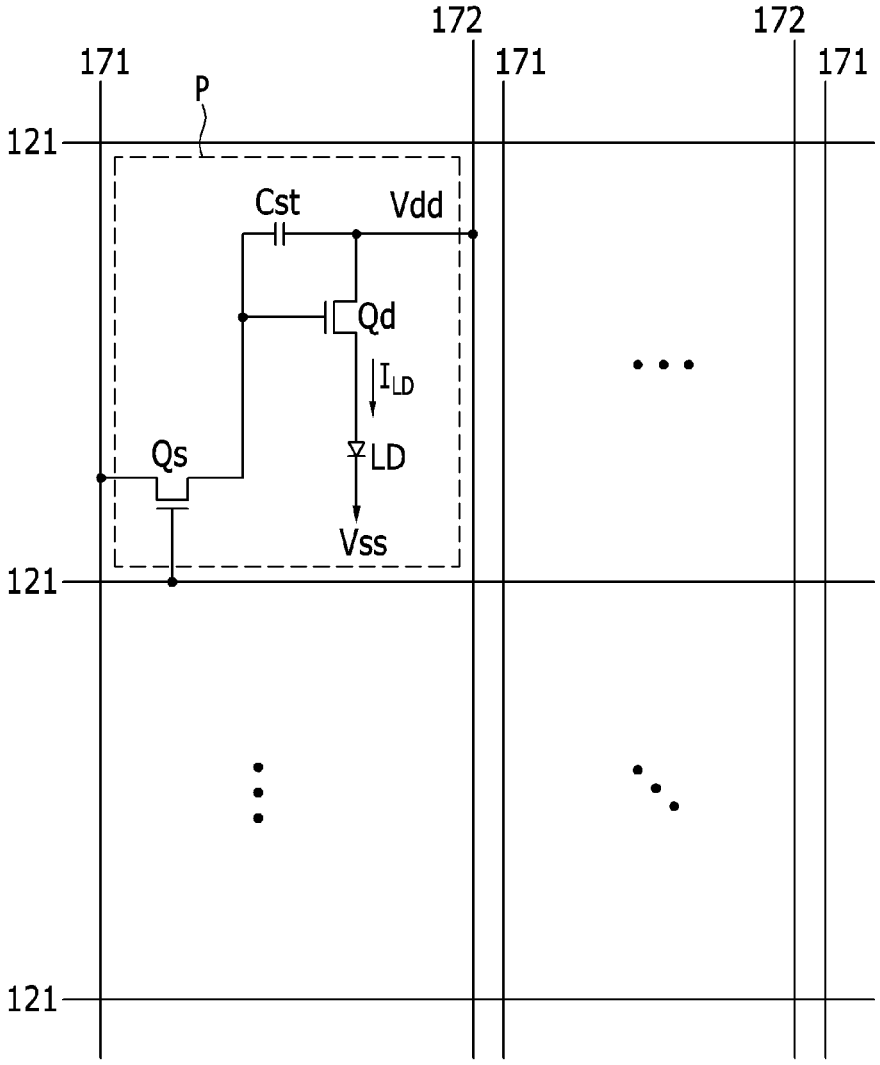
FIG. 2 is an equivalent circuit diagram of one pixel of the OLED display according to the exemplary embodiment.

FIG. 1 is a plan view schematically illustrating an OLED display according to an exemplary embodiment nd FIG. 2 is an equivalent circuit diagram of one pixel of the OLED display according to the exemplary embodiment As illustrated in FIG. 1, an OLED display 1000 according to an exemplary embodiment includes a substrate 100 in which a pixel area PA and a surrounding area SA enclosing the pixel area PA is divided, a plurality of pixels Ps formed in the pixel area PA of the substrate 100, drivers 600 and 700 formed in the surrounding areas SA of the substrate 100 and connected to the pixels Ps, respectively, and a power supply unit 400.

A plurality of signal lines 121, 171, and 172 which are formed from the surrounding area SA to the pixel area PA are formed on the substrate 100 and the pixels Ps are connected thereto and are arranged approximately in a matrix form.

The signal lines 121, 171, and 172 include a plurality of first signal lines 121 which transfer gate signals (or scanning signals), a plurality of second signal lines 171 which transfer data signals, and a plurality of third signal lines 172 which transfers a driving voltage Vdd. The first signal lines 121 extend in approximately a row direction and are approximately parallel with each other and the second signal line 171 and the third signal line 172 intersect each other with being insulated from the first signal line, extend in a column direction, and are approximately parallel with each other.

Referring to FIG. 2, each pixel P includes a driving thin film transistor Qd, switching thin film transistor Qs, a storage capacitor Cst, and an organic light emitting diode (OLED) LD.

The driving thin film transistor Qd also have a control terminal, an input terminal, and an output terminal, in which the control terminal is connected to the switching thin film transistor Qs, the input terminal is connected to the third signal line 172, and the output terminal is connected to the organic light emitting diode (OLED) LD. The driving thin film transistor Qd transfers an output current $I_{LD}$ of which a magnitude varies depending on a voltage applied between the control terminal and the output terminal.

The switching thin film transistor Qs also includes a control terminal, an input terminal, and an output terminal, in which the control terminal is connected to the first signal line 121, the input terminal is connected to the second signal line 171, and the output terminal is connected to the driving thin film transistor Qd. The switching thin film transistor Qs transfers the data signal applied to the second signal line 171 to the driving thin film transistor Qd in response to the scanning signal applied to the first signal line 121.

The storage capacitor Cst is connected between the control terminal and the input terminal of the driving thin film transistor Qd. The storage capacitor Cst charges the data signal applied to the control terminal of the driving thin film transistor Qd and maintains the charged data signal even after the switching off the thin film transistor Qs.

The OLED has an anode connected to the output terminal of the driving thin film transistor Qd and a cathode connected to a common voltage Vss. The organic light emitting diode (OLED) LD displays an image by emitting light of which the strength varies depending on the output current $I_{LD}$ of the driving thin film transistor Qd.

Referring again to FIG. 1, the surrounding area SA is provided with a plurality of anti-crack grooves CPs to prevent a crack of the substrate 100. The anti-crack grooves CPs are formed along corners of the substrate 100 to enclose the pixel area PA and are adjacently positioned to ends of the substrate 100.

Further, the surrounding area SA is provided with at least one dam D1, D2, and D3 to prevent the organic material positioned in the pixel area PA from overflowing to edges of the substrate. FIG. 1 illustrates that three dams are formed but the dam may be formed in one or at least four, if necessary.

The dams D1, D2, and D3 are formed to enclose the pixel area PA and are positioned between the pixel area PA and the anti-crack groove CP.

Meanwhile, at least one anti-overflowing groove V is formed between the dams D1, D2, and D3 and the pixel area PA. FIG. 1 illustrates that the anti-overflowing groove V is formed between the second dam D2 and the third dam D3 but the present disclosure is not limited thereto. Therefore, the anti-overflowing groove V may be formed (not illustrated) between the first dam and the pixel area and the first dam and the second dam, if necessary.

As such, when the anti-overflowing groove is formed between the dams, even though the organic material overflows the dam positioned in front of the groove before the organic material forming the encapsulation layer for protecting the pixel area is hardened, the organic material flows in the anti-overflowing groove V to prevent the organic material from flowing out of the dam positioned after the anti-overflowing groove V.

Hereinafter, a laminar structure of the OLED display according to the exemplary embodiment will be described in detail with reference to the accompanying drawings. In this case, the switching thin film transistors and the driving thin film transistors of a red pixel PR, a green pixel PG, and a blue pixel PB, respectively, have the same laminar structure, and therefore the driving thin film transistor Qd and the organic light emitting diode (OLED) LD of the red pixel PR will be described in detail depending on the stacked order. Hereinafter, the driving thin film transistor Qd is referred to as a thin film transistor Q. Further, the surrounding area of the OLED display may be provided with transistors and driving circuits of the display area, together. The driving circuit includes a plurality of signal lines and a plurality of transistors, and therefore a transistor TS of one circuit unit will be described as an example.

Figure 3:
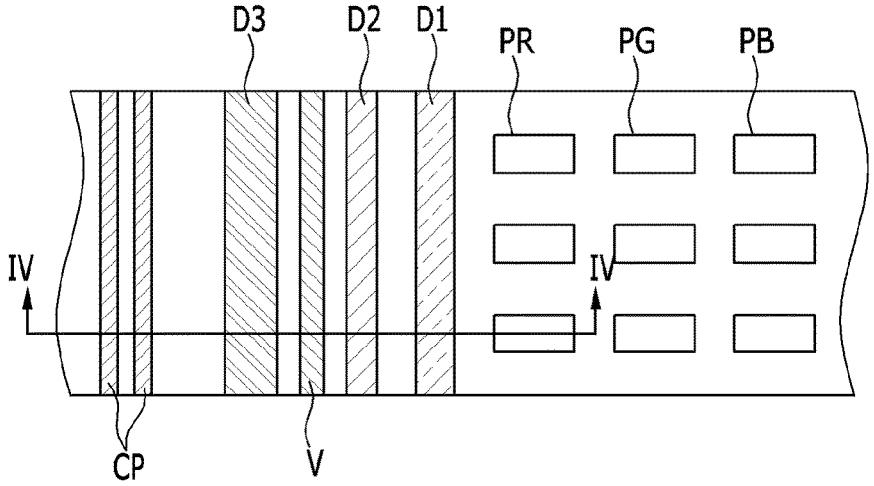
FIG. 3 is an enlarged plan view of portion A of FIG. 1.
Figure 4:
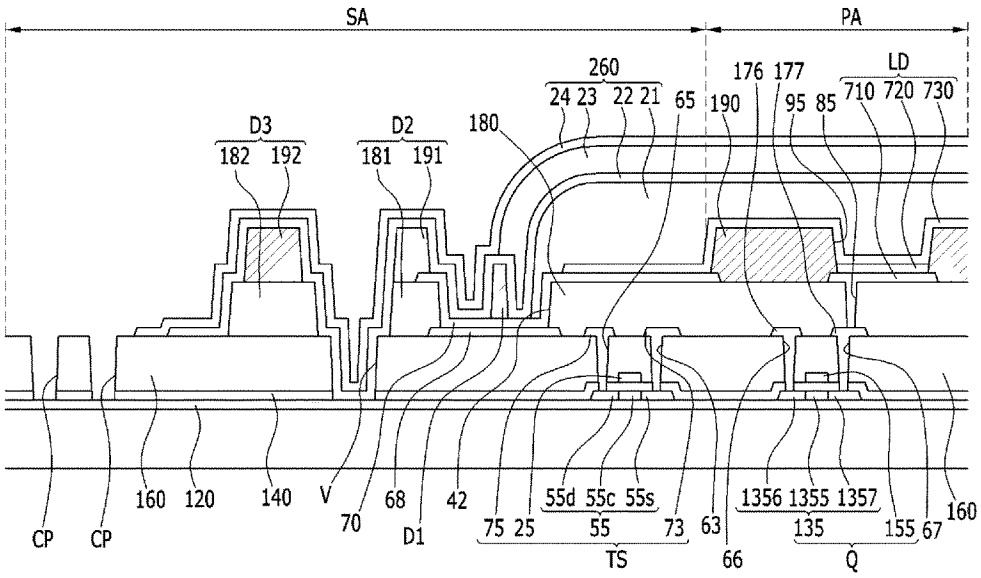
FIG. 4 is a cross-sectional view taken along the line IV-IV of FIG. 3.

FIG. 3 is an enlarged plan view of portion A of FIG. 1 and FIG. 4 is a cross-sectional view taken along the line IV-IV of FIG. 3.

As illustrated in FIGS. 3 and 4, the OLED display 1000 includes the substrate 100, in which a buffer layer 120 is formed on the substrate.

The substrate 100 may be made of plastic such as polycarbonate, polyimide, and polyether sulfone, glass, or the like. The substrate may be a transparent flexible substrate having flexibility, such as elasticity, or the like, which may be folded, bent, rolled, or stretched in at least one direction.

The buffer layer 120 may have a single layer structure made of silicon nitride (SiNx) or a double layer structure in which silicon nitride (SiNx) and silicon oxide ($SiO_x$) are stacked. The buffer layer 120 serves to planarize a surface while preventing permeation of unnecessary components, such as impurities and moisture.

Semiconductors 55 and 135 are formed on the buffer layer 120. The semiconductors 55 and 135 may be made of polysilicon or oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and an indium-gallium-zinc oxide ($InGaZnO_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. When the semiconductors 55 and 135 are made of the oxide semiconductor, a separate passivation layer may be added to protect the oxide semiconductor which is vulnerable to external environments, such as high temperature.

The semiconductor 55 and 135 includes channels 55c and 1355 which are channel-doped with N-type impurity or P-type impurity and source doping regions 55s and 1356 and drain doping regions 55d and 1357 which are formed at both sides of the channel and have doping concentration higher than that of impurity with which the channel is doped.

A gate insulating layer 140 is formed on the semiconductors 55 and 135. The gate insulating layer 140 may be a single layer or plural layers including at least one of tetraethyl orthosilicate (TEOS), silicon nitride, and silicon oxide.

Gate electrodes 25 and 155 are formed on the semiconductors 55 and 135 and the gate electrodes 25 and 155 overlap the channel regions 55c and 1355.

The gate electrodes 25 and 155 may be formed of a single layer or plural layers including low resistance materials such as Al, Ti, Mo, Cu, Ni or an alloy thereof or materials having strong corrosion.

A first interlayer insulating layer 160 is formed on the gate electrodes 25 and 155. Like the gate insulating layer 140, the first interlayer insulating layer 160 may be formed in a single layer or plural layers including tetraethyl orthosilicate (TEOS), silicon nitride, silicon oxide, or the like.

The first interlayer insulating layer 160 and the gate insulating layer 140 are provided with source contact holes 63 and 66 and drain contact holes 65 and 67 through which the source regions 55s and 1356 and the drain regions 55d and 1357 are each exposed.

A power terminal 68, source electrodes 73 and 176, and drain electrodes 75 and 177 are formed on the first interlayer insulating layer 160.

The power terminal 68 is positioned in a power supply unit 400 and may be applied with external power.

The source electrodes 73 and 176 each contact the source regions 55s and 1356 through the contact holes 63 and 66 and the drain electrodes 75 and 177 are each connected to the drain regions 55d and 1357 through the contact holes 65 and 67.

The source electrodes 73 and 176 and the drain electrodes 75 and 177 may be formed of a single layer or plural layers including low resistance materials such as Al, Ti, Mo, Cu, Ni or an alloy thereof or materials having strong corrosion resistance. For example, they may be formed in a triple layer of Ti/Cu/Ti, Ti/Ag/Ti, Mo/Al/Mo.

The gate electrodes 25 and 155, the source electrodes 73 and 176, and the drain electrodes 75 and 177 each are a control electrode, an input electrode, and an output electrode of FIG. 3 and form thin film transistors TS and Q together with the semiconductors 55 and 135. The channel of the thin film transistor is formed in the semiconductor 135 between the source electrodes 55s and 176 and the drain electrodes 55d and 177.

A second interlayer insulating layer 180, a lower layer 181 of a second dam, and a lower layer 182 of a third dam are formed on the source electrodes 73 and 176 and the drain electrodes 75 and 177.

The second interlayer insulating layer 180 includes a contact hole 85 through which the drain electrode 177 is exposed and includes the anti-overflowing groove V which is formed in the second interlayer insulating layer 180, the first interlayer insulating layer 160, and the gate insulating layer 140 to expose the buffer layer 120, and a plurality of anti-crack grooves CPs.

The exemplary embodiment illustrates that the anti-overflowing groove V is formed up to the gate insulating layer 140 to expose the buffer layer 120 but is not limited thereto. Therefore, if necessary, the anti-overflowing groove V may be formed to expose (not illustrated) the gate insulating layer 140 or the first interlayer insulating layer 160.

The anti-crack groove CP is to prevent a crack of the inorganic layer which is relatively vulnerable to crack and the anti-crack groove CP is preferably formed on a layer formed of an inorganic layer among the gate insulating layer or the interlayer insulating layer.

Like the first interlayer insulating layer 140, the second interlayer insulating layer 180 may be formed in a single layer or plural layers including tetraethyl orthosilicate (TEOS), silicon nitride, silicon oxide, or the like and may be made of a low-permittivity organic material.

The lower layer 181 of the second dam and the lower layer 182 of the third dam may be made of the same material as the second interlayer insulating layer 180 together.

A connecting member 70 and a first electrode 710 are formed on the second interlayer insulating layer 180.

The first electrode 710 is electrically connected to the drain electrode 177 through the contact hole 85 and the first electrode 710 may be an anode of the OLED of FIG. 3.

The connecting member 70 is connected to the power terminal 68 through a contact hole 42.

According to the exemplary embodiment, the interlayer insulating layer is formed between the first electrode 710 and the drain electrode 177, but the first electrode 710 may be formed on the same layer as the drain electrode 177 and may be integrated with the drain electrode 177.

A pixel defined layer 190 is formed on the first electrode 710 and a first dam D1 is formed on the connecting member 70. An upper layer 191 of the second dam is formed on the lower layer 181 of the second dam and an upper layer 192 of the third dam is formed on the lower layer 182 of the third dam.

The pixel defined layer 190 has an opening 95 through which the first electrode 710 is exposed. The pixel defined layer 190 may be made of resin such as polyacrylates or polyimides, silica-based inorganic materials, and the like.

The first dam D1, the upper layer 191 of the second dam, and the upper layer 192 of the third dam pixel may be made of the same material as the pixel defined layer 190 and the first dam D1 may overlap some of the connecting member 70.

An organic light emitting layer 720 is formed on the opening 190 of the pixel defined layer 95.

The organic light emitting layer is formed of a plurality of layers which include at least one of a light emitting layer, a hole-injection layer (HIL), a hole-transporting layer (HTL), an electron-transporting layer (ETL), and an electron-injection layer (EIL).

When the organic light emitting layer 720 includes both of them, the hole injection layer is disposed on the first electrode 710 which is the anode and the hole transport layer, the light emitting layer, the electron transport layer, and the electron injection layer may be stacked thereon.

The emission layer 720 may include a red emission layer which emits red light, a green emission layer which emits green light, and a blue emission layer which emits blue light, in which the red emission layer, the green emission layer, and the blue emission layer are each formed in a red pixel, a green pixel, and a blue pixel to implement a color image.

Further, the emission layer 720 may be formed by stacking the red emission layer, the green emission layer, and the blue emission layer in all of the red pixel, the green pixel, and the blue pixel and forming a red color filter, a green color filter, and a blue color filter for each pixel to implement a color image. As another example, the color image may be implemented by forming a white emission layer which emits white light in all of the red pixel, the green pixel, and the blue pixel and forming the red color filter, the green color filter, and the blue color filter for each pixel. At the time of implementing the color image using the white emission layer and the color filters, there is no need to use a deposition mask for depositing the red emission layer, the green emission layer, and the blue emission layer on each pixel, that is, the red pixel, the green pixel, and the blue pixel.

Further, the white emission layer may be formed of one emission layer which emits white light and the emission layer which emits light of a plurality of different colors may be stacked to emit white light. For example, the white emission layer may also include a configuration to emit white light by combining at least one yellow emission layer with at least one blue emission layer, a configuration to emit white light by combining at least one cyan emission layer with at least one red emission layer, and a configuration to emit white light by combining at least one magenta emission layer with at least one green emission layer, and the like.

The second electrode 730 which is a cathode of FIG. 2 is formed on the pixel defined layer 190 and the organic emission layer 720.

The first electrode 710, the organic emission layer 720, and the second electrode 730 form the organic light emitting diode LD.

The OLED display may have any one structure of a front display type, a rear display type, a double-sided display type depending on a direction in which the organic light emitting diode (OLED) LD emits light.

In the case of the front display type, the first electrode 710 is formed of a reflective layer and the second electrode 730 is formed of a transflective layer or a transparent layer. On the other hand, in the case of the rear display type, the first electrode 710 is formed of a transflective layer and the second electrode 730 is formed of a reflective layer. Further, in the case of the double-sided display type, the first electrode 710 and the second electrode 730 are formed of a transparent layer or a transflective layer.

The reflective layer and the transflective layer are made of at least one metal of magnesium (Mg), silver (Ag), gold (Au), calcium (Ca), lithium (Li), chromium (Cr), and aluminum (Al) or an alloy thereof. The reflective layer and the transflective layer are determined as a thickness and the transflective layer may be formed of a thickness of 200 nm or less. The thickness is inversely proportional to the transmittance of light and inversely proportional to the resistance.

The transparent layer is made of materials such as indium tin oxide (ITO), indium zinc oxide (IZO), zinc oxide (ZnO), and indium oxide ($In_2O_3$).

The second electrode 730 may be applied with a cathode voltage through the connecting member 70 which is connected to the power terminal 68.

An encapsulation layer 260 is formed on the second electrode.

At least one organic layer and at least one inorganic layer may alternate each other to form the encapsulation layer 260. The inorganic layer or the organic layer may be each formed in plural and FIG. 4 illustrates that two inorganic layers 22 and 24 and two organic layers 21 and 23 are formed.

The organic layers 21 and 23 may be formed of polymer, and may be, preferably, a single film or a stacked film formed of any one of polyethylene terephthalate, polyimide, polycarbonate, epoxy, polyethylene, and polyacrylate. More preferably, the organic layer may be formed of polyacrylate. Therefore, the organic layer may include a polymerized monomer composition including a diacrylate based monomer and a triacrylate based monomer. A monoacrylate-based monomer may further be included in a monomer composition, Further, a known photo initiator such as TPO may be further included in the monomer composition but is not limited thereto.

The inorganic layers 22 and 24 may be a single layer or a stacked layer including metal oxide or metal nitride. Therefore, the inorganic layer may include any one of SiNx, $Al_2O_3$, $SiO_2$, and $TiO_2$.

An uppermost layer exposed to the outside in the encapsulation layer may be the organic layer to prevent moisture from being permeated into the OLED.

The encapsulation layer may include at least one sandwich structure in which at least one organic layer is inserted between at least two inorganic layers.

The encapsulation layer may sequentially include a first inorganic layer, a first organic layer, and a second inorganic layer from the second electrode of the OLED. Further, the encapsulation layer may sequentially include the first inorganic layer, the first organic layer, the second inorganic layer, the second organic layer, and a third inorganic layer from the second electrode. Further, the encapsulation layer may sequentially include the first inorganic layer, the first organic layer, the second inorganic layer, the second organic layer, the third inorganic layer, and a third organic layer, and a fourth inorganic layer from the upper portion of the second electrode.

A metal halide layer including LiF may be further included between the second electrode and the first inorganic layer. The metal halide layer prevents the OLED including the second electrode from being damaged when the first inorganic layer is formed by a sputtering method or a plasma deposition method.

The first organic layer may have an area narrower than that of the second inorganic layer and the second organic layer may have an area narrower than that of the third inorganic layer. Therefore, the first organic layer may be completely covered with the second inorganic layer and the second organic layer may be completely covered with the third inorganic layer. Therefore, an end of the lower layer which is positioned under an upper layer is not exposed by the upper layer which is positioned above the lower layer.

Meanwhile, according to the exemplary embodiment, when the anti-overflowing groove is formed, it is possible to prevent the organic material from overflowing to the edge of the substrate at the time of forming the organic layer.

This will be described below in detail with reference to FIG. 5.

Figure 5:
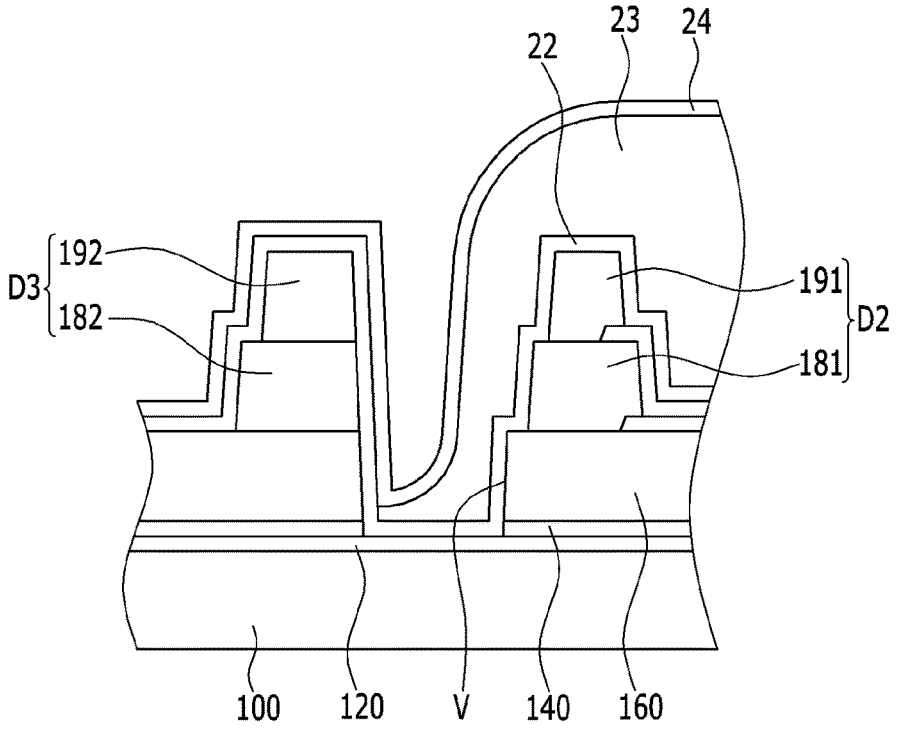
FIG. 5 is an enlarged cross-sectional view of an anti-overflowing groove formed according to an exemplary embodiment.

FIG. 5 is an enlarged cross-sectional view of an anti-overflowing groove formed according to an exemplary embodiment.

As illustrated in FIG. 5, the first inorganic layer 22 is formed on the substrate 100 and the organic material is applied on the inorganic layer 22 to form the second organic layer 23. The organic material moves to the edges of the substrate before being hardened and is spread. In this case, when the organic material is over-applied, the organic material overflows the first dam D1 and the dam D2 and thus flows in the anti-overflowing groove V.

Since the over-applied organic material fills the anti-overflowing groove V and then overflows the third dam D3, most of the organic material overflowing the second dam D2 is stored in the anti-overflowing groove V and therefore does not overflow the third dam D3.

Therefore, the height of the third dam D3 rises along with the depth of the anti-overflowing groove V due to the anti-overflowing groove V, and therefore the organic material hardly overflows the third dam D3.

As such, according to the exemplary embodiment, the anti-overflowing groove is formed, and thus the height of the third dam may be increased without further forming the dam, thereby easily preventing the overflowing of the organic material.

The foregoing exemplary embodiments describe only the second organic layer 23, but are not limited thereto. Therefore, it may be expected that the same effect may be obtained even by the additionally formed organic layer (not illustrated) after the first organic layer (not illustrated) and the second inorganic layer 24 are formed.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

[1. An OLED display, comprising:

a substrate having a pixel area and a surrounding area enclosing the pixel area;

an OLED formed in the pixel area;

an anti-overflowing groove formed in the surrounding area of the substrate; and a dam positioned between the anti-overflowing groove and an end of the substrate, a semiconductor formed in the pixel area;

a gate insulating layer formed on the semiconductor and the substrate;

a gate electrode formed on the gate insulating layer;

a first interlayer insulating layer formed on the gate electrode and the gate insulating layer;

a source electrode and a drain electrode formed on the first interlayer insulating layer;

a second interlayer insulating layer formed on the source electrode and a drain electrode; and a pixel defined layer having an opening which is formed on the second interlayer insulating layer and exposes the first electrode, wherein the anti-overflowing groove is formed through the first interlayer insulating layer and exposes the gate insulating layer, wherein the OLED includes: a first electrode formed on the second interlayer insulating layer; an organic light emitting layer formed on the first electrode, and a second electrode formed on the organic emission layer, and wherein the dam includes a lower layer made of the same material as the second interlayer insulating layer and an upper layer positioned on the lower layer and made of the same material as the pixel defined layer.]

[2. The OLED display of claim 1, further comprising:

a buffer layer formed on the substrate, wherein the anti-overflowing groove is formed through the first interlayer insulating layer and the gate insulating layer and exposes the buffer layer.]

[3. The OLED display of claim 1, wherein:
the dam includes a first dam and a second dam positioned at both sides, having the anti-overflowing groove disposed there between.]

[4. The OLED display of claim 3, wherein:
the dam further includes a first dam, a second dam, and a third dam having the anti-overflowing groove disposed between the second and third dam.]

[5. The OLED display of claim 1, further comprising:
an encapsulation layer positioned on the substrate and covering the pixel area,
wherein the encapsulation layer includes at least one inorganic layer and organic layer.]

[6. The OLED display of claim 1, further comprising:
an anti-crack groove positioned between the dam and the end of the substrate.]

*7. An OLED display, comprising:*
*a flexible substrate having a pixel area;*
*a semiconductor layer formed in the pixel area and disposed on the flexible substrate;*
*a gate insulating layer disposed on the semiconductor and the flexible substrate;*
*a gate electrode disposed on the gate insulating layer;*
*a first interlayer insulating layer disposed on the gate electrode and the gate insulating layer;*
*a first electrode and a second electrode disposed on the first interlayer insulating layer;*
*a second interlayer insulating layer disposed on the first electrode and the second electrode;*
*a first emission electrode electrically connected to the second electrode on the second interlayer insulating layer;*
*a pixel defined layer having an opening and disposed on the second interlayer insulating layer exposing the first electrode;*
*an organic emission layer disposed on the first emission electrode;*
*a second emission electrode disposed on the organic emission layer;*
*a first inorganic insulating layer disposed over the second emission electrode;*
*an organic insulating layer disposed over the first inorganic insulating layer;*
*a first dam comprised of a pattern of the pixel defined layer disposed along an edge of the flexible substrate; and*
*a first groove disposed through the first interlayer insulating layer between the first dam and the edge of the flexible substrate; wherein the first inorganic insulating layer does not cover over the first groove,*
*wherein the organic insulating layer does not cover over the first dam.*

*8. The OLED display of claim 7, further comprising:*
*a buffer layer disposed between the flexible substrate and the semiconductor layer.*

*9. The OLED display of claim 7, further comprising:*
*a second inorganic insulating layer disposed on the organic insulating layer.*

*10. The OLED display of claim 9, wherein the first inorganic insulating layer and second inorganic insulating layer cover over the first dam.*

*11. The OLED display of claim 10, wherein the second interlayer insulating layer is made of an organic layer.*

*12. The OLED display of claim 7, wherein the first dam is further comprised of a pattern of the second interlayer insulating layer.*

*13. The OLED display of claim 7, further comprising:*
*a second groove disposed between the first dam and the edge of the flexible substrate.*

*14. The OLED display of claim 7, further comprising:*
*a second inorganic insulating layer on the organic insulating layer.*

*15. The OLED display of claim 14, wherein the first inorganic insulating layer and second inorganic insulating layer cover over the first dam.*

*16. The OLED display of claim 15, wherein the second interlayer insulating layer is made of an organic layer.*

*17. The OLED display of claim 16, wherein the first dam is further comprised of a pattern of the second interlayer insulating layer.*

*18. The OLED display of claim 8, further comprising:*
*a second inorganic insulating layer on the organic insulating layer.*

*19. The OLED display of claim 18, wherein the first inorganic insulating layer and second inorganic insulating layer cover over the first dam.*

*20. The OLED display of claim 19, wherein the second interlayer insulating layer is made of an organic layer.*

*21. The OLED display of claim 20, wherein the first dam is further comprised of a pattern of the second interlayer insulating layer.*

*22. The OLED display of claim 21, wherein the first dam is further comprised of a pattern of the gate insulating layer.*

*23. The OLED display of claim 22, further comprising:*
*a second dam comprised of the same layers of the first dam is disposed between the first dam and the edge of the flexible substrate.*

*24. The OLED display of claim 23, wherein the second dam is covered by the first inorganic layer and the second inorganic layer.*

*25. The OLED display of claim 24, wherein a third groove is disposed between the first dam and second dam.*

*26. The OLED display of claim 25, wherein the first dam and the second dam are further comprised of patterns of the first interlayer insulating layer.*

*27. The OLED display of claim 7, further comprising:*
*a connecting member electrically connected to the second emission electrode.*

*28. The OLED display of claim 27, further comprising:*
*a second inorganic insulating layer on the organic insulating layer.*

*29. The OLED display of claim 28, wherein the first inorganic insulating layer and the second inorganic insulating layer cover over the first dam and the connecting member.*

*30. The OLED display of claim 29, wherein the second interlayer insulating layer is made of an organic layer.*

*31. The OLED display of claim 30, wherein the first dam is further comprised of a pattern of the second interlayer insulating layer.*

*32. The OLED display of claim 7, wherein the first groove disposed through the gate insulating layer and the first interlayer insulating layer exposes a portion of a buffer layer disposed on the flexible substrate between the dam and the edge of the flexible substrate.*

*33. The OLED display of claim 7, further comprising:*
*a second dam comprised of the same layers of the first dam disposed between the first dam and the pixel area, wherein the second dam is completely covered by the organic insulating layer.*

* * * * *